United States Patent
Wandel

(10) Patent No.: US 8,296,631 B2
(45) Date of Patent: Oct. 23, 2012

(54) POWER RECEPTION OPTIMIZATION METHOD, AND ASSOCIATED APPARATUS, FOR OPERATING UPON AN ENCODED DATA BLOCK

(75) Inventor: Matthias Wandel, Waterloo (CA)

(73) Assignee: Research In Motion Limited, Waterloo (CA)

( * ) Notice: Subject to any disclaimer, the term of this patent is extended or adjusted under 35 U.S.C. 154(b) by 1070 days.

(21) Appl. No.: 12/233,415

(22) Filed: Sep. 18, 2008

(65) Prior Publication Data

US 2009/0019339 A1    Jan. 15, 2009

Related U.S. Application Data

(63) Continuation of application No. 10/992,610, filed on Nov. 17, 2004, now Pat. No. 7,434,147.

(60) Provisional application No. 60/555,862, filed on Mar. 24, 2004.

(51) Int. Cl.
*H03M 13/00* (2006.01)

(52) U.S. Cl. .......................... 714/778; 714/746; 714/755

(58) Field of Classification Search .................. 714/778, 714/746, 751, 755
See application file for complete search history.

(56) References Cited

U.S. PATENT DOCUMENTS

| | | | |
|---|---|---|---|
| 5,168,356 A * | 12/1992 | Acampora et al. | 375/240.15 |
| 5,181,207 A | 1/1993 | Chapman | |
| 5,182,749 A | 1/1993 | Kazecki et al. | |
| 5,404,374 A | 4/1995 | Mullins et al. | |
| 6,173,431 B1 * | 1/2001 | Rittle | 714/778 |
| 7,286,622 B2 * | 10/2007 | Sefidvash et al. | 375/354 |
| 2002/0101846 A1 | 8/2002 | Erben et al. | |
| 2004/0253958 A1 | 12/2004 | Chang et al. | |

FOREIGN PATENT DOCUMENTS

WO    92/22145 A1    12/1992

* cited by examiner

*Primary Examiner* — Fritz Alphonse

(57) ABSTRACT

Apparatus, and an associated method, for recovering the informational content of an encoded data block. Data bursts are delivered to a receiver. A series of data bursts together include all of the informational content of the encoded data block. A detector detects delivery to the receiver of the data bursts. A determiner determines indicia associated with the communicated data. And, responsive thereto, the data is decoded, selectably utilizing fewer than all of the data bursts that form the encoded data block.

18 Claims, 3 Drawing Sheets

POWER RECEPTION OPTIMIZATION METHOD, AND ASSOCIATED APPARATUS, FOR OPERATING UPON AN ENCODED DATA BLOCK

CROSS REFERENCE TO RELATED APPLICATION

The present application is a continuation application of co-pending patent application Ser. No. 10/992,610 filed Nov. 17, 2004, which claims the priority of U.S. Patent Application No. 60/555,862, filed Mar. 24, 2004, the contents of which are incorporated herein by reference.

FIELD OF THE INVENTION

The present invention relates generally to a manner by which to detect an encoded data block at a receiver, such as the receive part of a mobile station operable in a GSM (Global System Mobile communications) that provides for GPRS (General Packet Radio Service) communication services. More particularly, the present invention relates to apparatus, and an associated method, that facilitates decoding of, and detection of, the informational content of the encoded data block responsive to reception of only a portion of the encoded data block.

Improved power performance of the receiver is provided. The receiver is not required to remain on to receive the entire encoded data block to permit recovery of the informational content of the data block. Instead, decoding of the data block is selectably performed upon delivery of only a portion of the encoded data block. Reduced receiver on-times reduces the power consumption of the receiver.

BACKGROUND OF THE INVENTION

A cellular communication system is exemplary of a radio communication system. Cellular communication systems, generally, provide for voice and data communication services. Multiple access by significant numbers of users is permitted in a cellular communication system. Cellular communication systems are popularly utilized and have achieved high levels of penetration in many areas. The network infrastructures of cellular communication systems have been deployed throughout significant portions of the populated areas of the world. Successive generations of cellular communication systems have been developed and deployed, sometimes overlayed upon one another over common geographical areas.

A GSM (Global System for Mobile communications) cellular communication system is representative of a cellular communication system that provides for voice and data services. Operational parameters of equipment operable in a GSM system are set forth in an operational specification promulgated by the EIA/TIA. Enhancements to the initially-deployed GSM system provide, amongst other things, for more extensive data services. An operational specification related to GPRS (General Packet Radio Service) for GSM has also been promulgated, and equipment that provides for GPRS communication services operate pursuant to the parameters set forth in the operational specification of the GPRS system.

Amongst other facets, the operational specification of the GSM/GPRS system defines signaling parameters by which various control, and other, signaling is effectuated during operation of the GSM/GPRS communication system. Because communications are regularly effectuated upon channels susceptible to fading, and other distortion, the operational specification of the system provides for encoding of data in manners to combat the effects of fading. Version 8.4 of the GSM specification includes sections GSM 05.02 relating to multiplexing and multiple access on the radio path and GSM 05.03 related to channel coding. Data bursts are further defined are further defined by a burst-type, such as a normal burst (NB), as described in the GSM 05.02, section 5.2.3. GSM and GPRS packet traffic is passed in bursts of the burst-type of normal burst.

GSM non-voice data is passed in channel types CCCH (Common Control Channel), SDCCH (Standalone Dedicated Control Channel), and SACCH (Slow Associated Control Channel). The encoding techniques, for data transmission, for these three channel types are identical. And, details associated with the encoding parameters are set forth in the GSM specification 05.03, section 4.1. This section specifies the encoding comprising block coding, convolutional encoding, interleaving, and mapping of encoded data onto a burst. The block code computes a forty bit, cyclic redundancy check (CRC) that is appended to 184 bits of data that are encoded in the block. The forty bits are designed to have maximum dependency on other bits in the block.

The convolutional code doubles the number of bits, and composes the new bits such that each of the new bits is to be based on three or four of the data bits from a previous step, i.e., data bits plus bits from the block code. The doubling of the number of bits adds to the redundancy of the data. A Viterbi algorithm is utilized to decode the convolutionally-encoded data. The Viterbi algorithm is able to decode the original data bits even if a substantial number of the bits have been inverted.

After convolutional encoding, the data block is interleaved so that consecutive bits end up in different positions on data bursts that are to be transmitted. And, four data bursts are transmitted to transmit the entire, encoded block. Bit errors are, many times, near each other in clusters of bit errors. By performing interleaving before transmitting, consecutive bits that are corrupted are spread out again by deinterleaving. This is done as the convolutional code is better at dealing with bit errors that are spread out than clustered errors that are clustered theretogether.

Subsequent to transmission and reception, decoding is performed. Decoding operations are performed in a manner reverse to that of the just-described encoding procedures. That is, first, the bits are de-interleaved from the bursts. Subsequently, Viterbi decoding is performed to reverse the convolutional encoding. The Viterbi algorithm that is executed to perform the Viterbi decoding relies upon redundancy in the convolutionally encoded data to detect and correct for corrupted bits, provided that only a relatively small number of bits have been inverted, i.e., corrupted. When the block is again decoded, the calculation is repeated to ensure that the forty bits computed from the 184 received data bits match the forty bits that were sent. If some of the data was incorrectly received, and not successfully corrected, the probability of the forty bits of the CRC forming a match is quite small. And, when erroneous data is received, the data is discarded.

GPRS packet data encoding is similar to encoding of packets in GSM. Several coding schemes are set forth in GPRS. A coding scheme (CS) 1 is identical to a corresponding scheme used in GSM, while coding schemes 2 and 3 also add puncturing, as per GSM 05.03, section 5. Coding scheme 4 has no error correction and omits the convolutional code.

Conventional decoding of a data block is performed subsequent to reception of four bursts that include all of the data of the encoded data block. Burst decoding is done on each burst. Once burst decoding is done, block decoding is performed on the blocks. Conventionally, bits are extracted from the bursts, then deinterleaving is performed, decoding of the convolutional code through execution of a Viterbi algorithm is performed, and the block code is verified.

When the mobile station is operated in an idle mode, or during a packet transfer mode, repetitive data blocks are communicated to the mobile station. Monitoring by the mobile station of each data block is power-consumptive, consuming the limited stored energy of a portable power supply that typically powers the mobile station.

If a manner could be provided by which to exploit the properties of the coding schemes by which a data block is encoded, thereby to reduce the need to monitor all of the encoded data blocks, improved power reception optimization would be provided.

It is in light of this background information related to the communication of encoded data in a radio, or other, communication system that the significant improvements of the present invention have evolved.

SUMMARY OF THE INVENTION

The present invention, accordingly, advantageously provides apparatus, and an associated method, by which to detect an encoded data block at a receiver, such as the receive part of a mobile station operable in a GSM (Global System for Mobile communications) cellular communication system that provides for GPRS (General Packet Radio Service).

Through operation of an embodiment of the present invention, a manner is provided that facilitates decoding of, and detection of, the informational content of the coded data block upon reception of only a portion of the data block.

Because decoding of the data block is selectably performed upon delivery of only a portion of the encoded data block, the receiver operates at improved power performance levels relative to conventional receivers as the receiver is not required to remain on to receive an entire, encoded data block. That is to say, reduced receiver on-times reduce the power consumption of the receiver.

In one aspect of the present invention, the informational content of an encoded data block is sent to the receiving station as a series of successive bursts, e.g., a series of four bursts. In the presence of a clean signal, i.e., when signal conditions are good, it is sometimes possible to decode a full data block in which a substantial number of bits are blanked-out. Operation of an embodiment of the present invention takes advantage of this possibility and provides a manner by which to decode the data block when only a fraction of the bursts have been received at the receiver. For instance, decoding is performed when only three of four data bursts have been received at the receiver. If decoding is successfully performed responsive to reception of the three data blocks, reception of the fourth data burst can be skipped.

In another aspect of the present invention, advantage is taken of the repetitive nature of transmission of certain data to the receiver. For instance, when receiving highly repetitive data, such as empty paging blocks while in an idle mode, or dummy blocks while waiting for traffic on a GPRS packet transfer channel, it is possible to establish with a high degree of certainty that two blocks are identical without comparing all of the data of the blocks. For instance, two blocks can be determined to be identical if bit values of a first burst are substantially identical. When such substantial identicity is determined, a newly-delivered encoded data block is determined to be identical to a previously-delivered encoded block. Reception, and subsequent decoding of, the remaining bursts of data that collectively form the entire encoded data block is skipped.

In one implementation, apparatus is provided for a mobile station operable in a cellular communication system that operates pursuant to a GSM/GPRS (Global System for Mobile communications/General Packet Radio Service) operational specification. An encoded data block is communicated to the mobile station through the communication of a successive series of four data bursts. Upon detection of delivery to the mobile station of a first of the data bursts, the values of bits of the initial burst are compared with stored values of previously-delivered data bursts, the encoded data blocks of which the previously-delivered data bursts are portions. If comparisons between the just-delivered data burst and a previously-delivered burst indicates that the values are in substantial conformity, a conclusion is reached that the just-delivered data burst is part of an encoded data block that is identical to a repetitively-delivered data block that has previously been delivered to, and decoded at, the receiving station. If, instead, the values of the bursts are determined not to be identical, then additional bursts of the encoded data block are received and analyzed.

In a further implementation, when three of the four data bursts that together form the informational content of a single, encoded data block are received at the receiver, and the signal characteristics indicate the signal to be of good conditions, and the data values of the encoded data block are of a particular encoding, e.g., a GSM CS-1 encoding, the data is operated upon without receiving the fourth data burst. The data bits of the fourth data burst are considered to be erased. And, the informational content of the entire data block is recovered with reception of only three of the four data bursts.

Thereby, when repetitive data is communicated to the mobile station, only a single one of the data bursts of the multiple data bursts of the encoded data block need to be received by the receiver to obtain the values of the encoded data block. And, even if the data is not repetitive, if signal conditions are good and the encoding type by which the data is encoded is of a selected type, the informational content of the entire data block is also recoverable responsive to reception of less than all of the data bursts of the data block. Improved power performance of the receive part of the mobile station is thereby provided.

In these and other aspects, therefore, apparatus, and an associated method, is provided for a radio receiver operable in a communication system. The radio receiver operates to receive an encoded data block, formed of an entire data block, communicated thereto. The encoded data block is communicated to the receiver as a series of a selected number of bursts of data. When all of the selected number of the bursts of data are communicated to the receiver, all of the encoded data is communicated to the receiver. The decoded data block is selectably recovered through detection of less than all of the selected number of the bursts of data. A detector is adapted to receive at least the less-than-all of the selected number of the bursts of the data. A determiner is coupled to the detector to receive indicia associated with the data received by the detector. The determiner determines characteristics of the data received by the detector. A decoded data recoverer is coupled to receive representations of the data detected by the detector and to the determiner to receive determinations made thereat. The decoded data recoverer selectably recovers the decoded data from the data detected by the detector responsive determinations made by the determiner. The data recovered by the decoded data recoverer are representative of the entire data block.

A more complete appreciation of the present invention and the scope thereof can be obtained from the accompanying drawings that are briefly summarized below, the following detailed description of the presently-preferred embodiments of the invention, and the appended claims.

DETAILED DESCRIPTION

Figure 1:
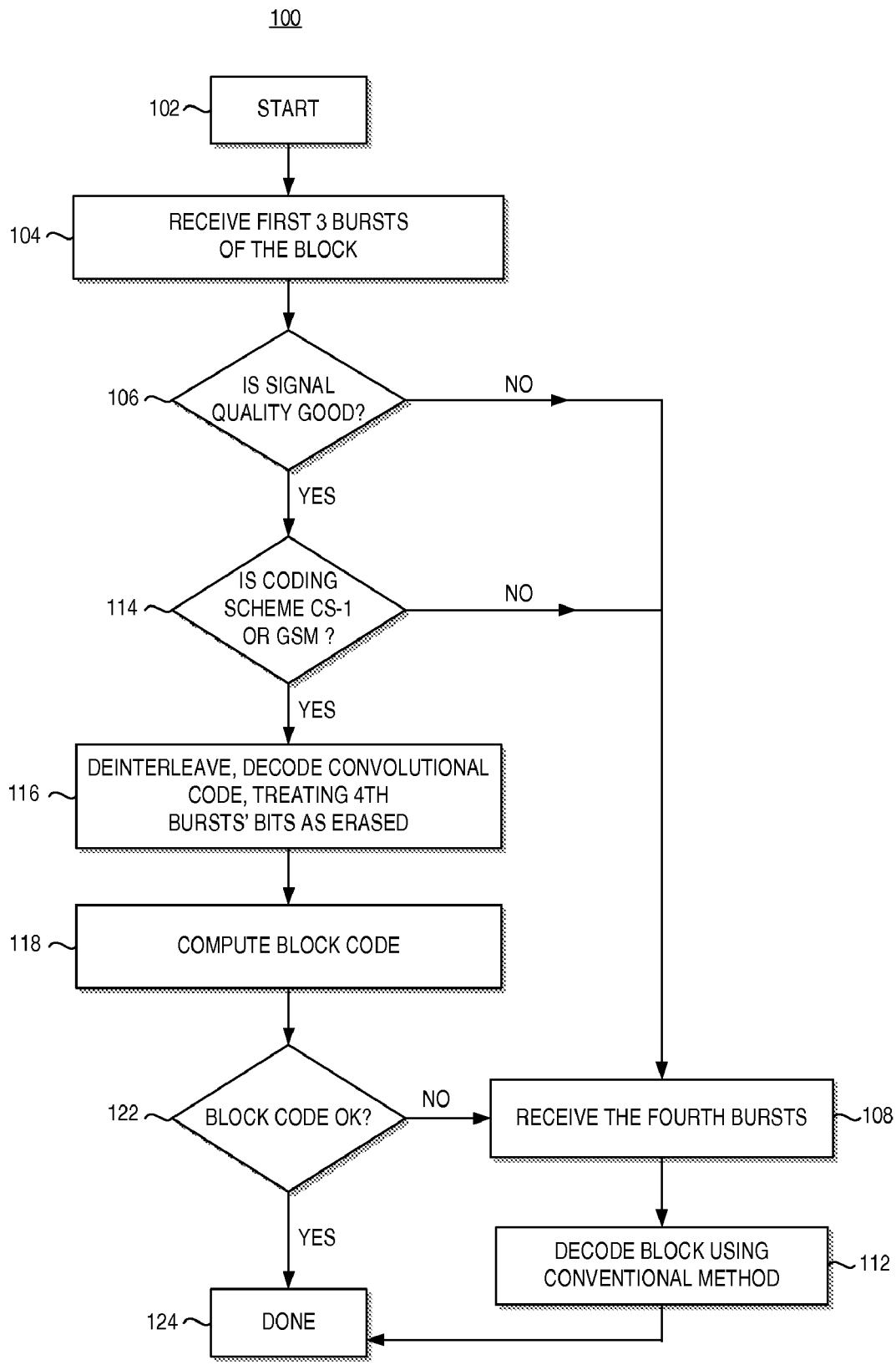
FIG. 1 illustrates a flow chart representative of operation of an embodiment of the present invention.

Referring first to FIG. 1, a process, shown generally at 100, is provided for a receiver, such as the receive part of a mobile station that operates in a cellular, or other radio, communication system. During operation of the communication system, encoded data blocks are communicated to the receiver. The encoded data blocks are communicated to the receiver in the form of data bursts in which a series of data bursts together include the informational content of the encoded data block.

More particularly, in the exemplary implementation, the process 100 is provided for a receive part of a mobile station operable pursuant to the operating parameters of the GSM/GPRS operating specification. While the following description shall describe operation of an embodiment of the present invention with respect to its exemplary implementation in a cellular communication system operable pursuant to the GSM/GPRS operational specification, the teachings of the present invention are analogously applicable to implementation in other types of communication systems in which encoded data blocks are communicated in the form of successive data bursts.

In a GSM/GPRS communication system, an encoded data block is communicated to a receiver, such as the receive part of a mobile station, in the form of a series of four data bursts that together form an encoded data block. The process 100 provides a manner by which to decode the encoded block upon reception of three of the four data bursts.

Provided that all of the bits are received at the receiver without, as is typically the case under good signal conditions, it is possible to "erase" a fraction of the bits and still successfully decode convolutionally encoded data. Erased bits are assumed to be neither ones or zeroes, but a half-way neutral value that gives equal preference to ones and zeroes. Such a manner by which to erase the fraction of the bits is utilized for puncturing of bits in GPRS coding scheme CS-2 and CS-3 (coding scheme-2 and coding scheme-3). The GPRS coding scheme CS-1 does not employ bit puncturing as this coding scheme is designed inherently to deal with worse signal conditions. The CS-1 scheme is also used for repetitive system traffic, irrespective of signal conditions. Operation of an embodiment of the present invention treats the bits of the fourth burst of a CS-1 block as "punctured" and still successfully decodes the encoded data block.

Entry into the process is indicated by the start block 102. Then, and as indicated at the block 104, the first three data bursts of the encoded block of data are delivered to the receiver.

Then, and as indicated by the decision block 106, a determination is made as to whether the signal quality is good, i.e., better than a selected threshold. Conventionally, in GSM, signal quality is derived block by block by doing the convolutional decoding using a viterbi algorithm. The quality metric is typically represented as a bit error rate. A measure of signal quality is derived for individual bursts, before they are decoded back into a block.

GSM and GPRS bursts are generally decoded using a process called a "viterbi equalizer". The viterbi equalizer is a separate algorithm/process from the viterbi algorithm used to decode the convolutional code. The viterbi equalizer uses a channel estimation, derived from the training sequence. To determine the most likely combination of bits that the received bursts represents.

For the signal quality of an individual burst, the total distance metric of the viterbi equalizer is used. The total distance metric is what the viterbi equalizer tries to minimize, which in turn maximizes the probability of picking the correct combination of bits that the received waveform actually represents. The distance metric represents the total difference between the received signal and the waveform that would be produced if the bits derived by the viterbi equalizer was re-encoded using the estimated channel model. Note this number is one of the statistics produced by the viterbi algorithm, so it is not necessary to re-modulate the burst to compute this distance metric.

The distance metric is a measure of error, typically due to noise. The larger this metric, the less the received waveform exactly matches what would be expected for a particular set of decoded bits. Thus, larger metrics mean increased odds of having picked the wrong bits. Thus, a larger distance metric represents lower confidence in the correctness of the burst, and thus lower signal quality.

If the signal quality is not good, then the no branch is taken to the block 108 and the additional data burst is received by the receiver. And, as indicated by the block 112, the encoded data block is decoded in conventional manner, i.e., through operations performed upon the data of all four of the data bursts.

If a determination is made at the decision block 106 that the signal quality is good, i.e., at least as good as a selected threshold, the yes branch is taken to the decision block 114. At the decision block 114, a determination is made whether the coding scheme that is utilized in the received data bursts corresponds to a CS-1 scheme as per the GSM 05.03, section 5.1.1 operational specification. In the exemplary implementation, only the first six of the eight coding scheme bits are checked as the remaining two bits are in the fourth burst. GSM control data blocks use a coding scheme that is equivalent to CS-1, so that this check, indicated by the decision block 114, is unnecessary for GSM blocks and can be obviated. If the coding scheme is not CS-1 or a GSM block, the no branch is taken to the block 108. It should be noted that the order of the decisions indicated by the decision blocks 106 and 114 are performable in reverse order.

If the coding scheme is CS-1 or the blocks are GSM control data blocks, the yes branch is taken to the block 116. At the block 116, decoding is performed using conventional mechanisms but with the missing bits from the fourth burst treated as being punctured. That is to say, deinterleaving and convolutional decoding is performed while the data bits of the missing, fourth data burst are treated as being punctured.

Then, and as indicated by the block 118, the forty-bit block code is computed. Then, and as indicated by the decision block 122, a determination is made as to whether the block code is ok. That is, a determination is made as to whether the computed block corresponds with a received copy of the block code. If the block codes do not match, the no branch is taken block 108. Otherwise, if the block codes match, the yes branch is taken to the block 124.

The operations indicated at 106, 114, 116, 118, and 122 are, in the exemplary implementation, performed quickly, between reception of the third data burst and subsequent delivery of a fourth data burst, i.e., in about four milliseconds. Thereby, branches are able to be taken to the block 108 in a timely manner, if required.

The process 100 is also used, in one implementation, to operate upon data blocks encoded with the GPRS coding scheme CS-2. However, as most highly-repetitive system traffic utilizes a coding scheme CS-1, a significant portion of the benefit is provided to use of the process with respect to operating upon data blocks encoded with the encoding schemes CS-1.

Figure 2:
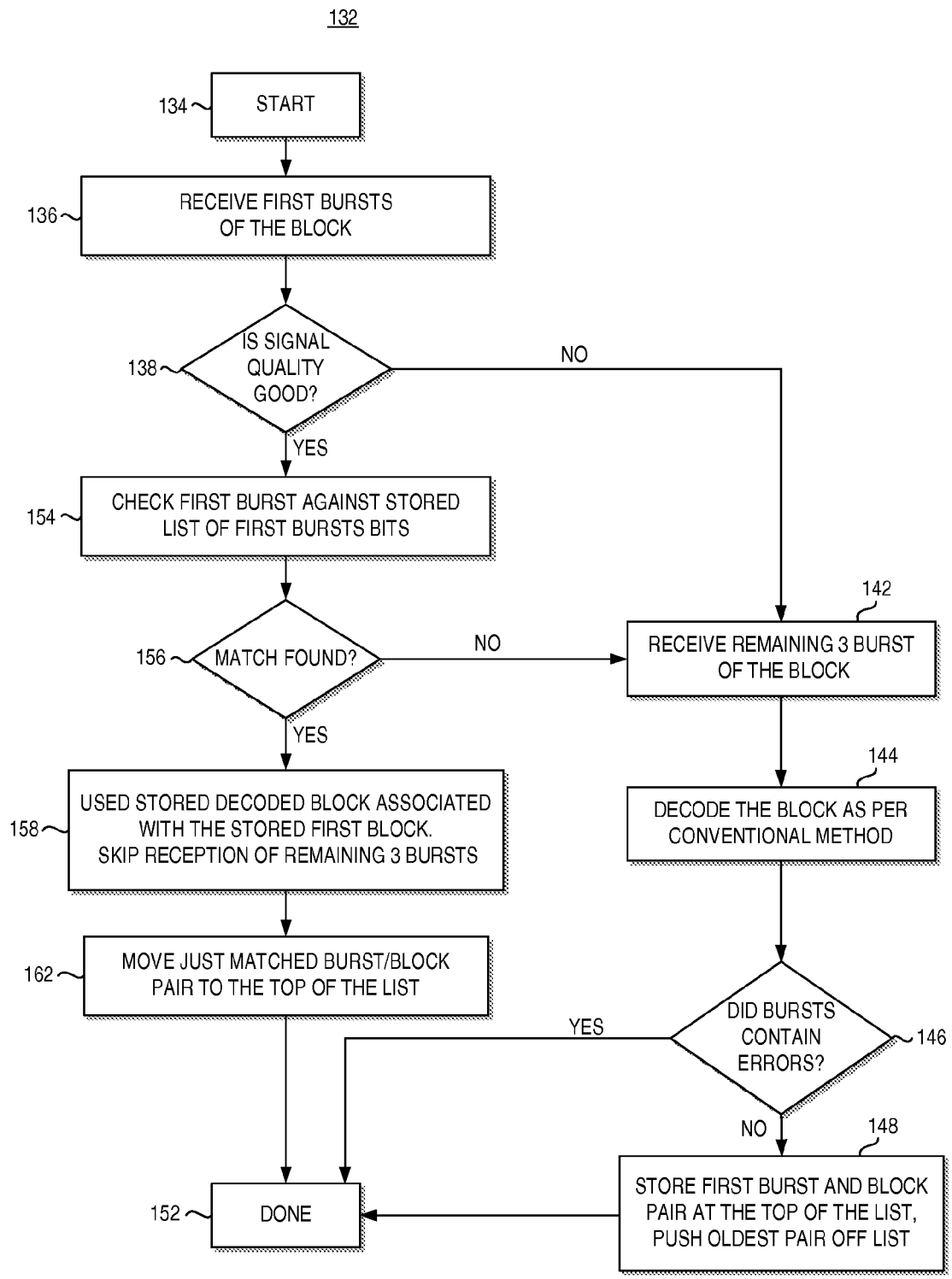
FIG. 2 illustrates a flow chart representative of operation of another embodiment of the present invention.

FIG. 2 illustrates a process, shown generally at 132, of another embodiment of the present invention. The process 132 operates to recognize identical bursts upon analysis of a first-received data block of the data bursts forming an encoded data block.

Because the convolutional code and the block code employed for GSM and GPRS CS-1, GSM 05.03, section 5.1.1, the bits of one burst are dependent upon all of the data bits within a data block. The forty parity bits are computed based upon the entire block, as set forth in GSM 05.03, section 5.1.2. The half rate convolutional code creates a string of 456 bits of which 85 bits are affected by the sixteen parity bits. Of these bits, twenty-two bits map onto the first burst after interleaving is performed. The CRC (Cyclic Redundancy Check) is reduced thereby to a twenty-bit certainty. The odds of different data matching the first twenty-two bits are, thus, one in U.S. Pat. No. 4,194,304. However, even without the CRC bits, each bit of the twenty-three byte block to be encoded affects one or two bits of the first burst. Thus, the probability of two different blocks having the exact same bits in the first burst is quite small.

To permit operation of the process 132, a table containing first-burst information and decoded blocks associated therewith are maintained. The table, or list, consists of pairs of first bursts and corresponding successfully decoded blocks associated with the first burst. The list is accessed, and subsequently used, to determine if a data block, just-received, is repetitive to a previously-delivered data block.

Entry into the process is indicated by the start block 134. Then, and as indicated by the block 136, the first burst of the encoded data block is received. A determination is then made, as indicated at the decision block 138, as to whether the signal quality is good. That is, the signal quality of the burst is determined. If the signal quality is determined to be poor, the no branch is taken to the block 142. And, the remaining data bursts, i.e., the remaining three data bursts, are received by the receiver. Upon receipt of the additional data bursts, and as indicated by the block 144, the data block is decoded in conventional manner.

Thereafter, and as indicated by the decision block 146, a determination is made as to whether the bursts contain errors, i.e., whether the bursts of the block were received cleanly and without error. If the bursts do not contain errors, i.e., the bursts are received cleanly and without error, the no branch is taken to the block 148 where, as indicated, the first burst and the decoded block associated therewith, are stored as a pair on a stored list of first bursts and blocks. In the exemplary implementation, the list is of a fixed size. And, to keep the list from growing indefinitely, an oldest pair is removed from the list when a new pair is stored thereat. In one implementation, the list has a size ranging between one and fifty items. If, conversely, a determination is made at the decision block 146 that the burst contain errors, i.e., that the block is not cleanly received without error, the yes branch is taken to the block 152, indicated to be a "done" block. A path is also taken from the block 148, after storage of the information at the list, to the done block 152.

If a determination is made at the decision block 138 that the signal quality is good, the yes branch is taken to the block 154. At the block 154, the bits of the first burst are compared against a stored list of first bursts. Then, and as indicated by the decision block 156, a determination is made whether a match is found. If no match is found, the no branch is taken to the block 142. And, decoding operations are performed conventionally, i.e., by analysis of all of the data bursts that together form an encoded block. If, conversely, a determination is made at the decision block 156 that a match is found on the stored list, the stored copy of the block associated with the matched first burst is assumed to be the contents of the block. And, receiving of the remaining three bursts is not required. And, as indicated by the block 158, the stored decoded block associated with the stored first block is used. Reception of the subsequent three data bursts is not required. And, as indicated by the block 162, the entry in the list that was just matched is moved to the top of the list to prevent the entry from falling off of the bottom of the list too soon. A path is then taken to the done block 152.

In one implementation, the processes 100 and 132 are combined into a single process. While not separately illustrated, the combined process is represented by replacing the operations 142 and 144 with the process 100. That is, the block 142 forming part of the process 132 is replaced with the block 104 of the process 100. The only required adjustment is that one burst of the three that are indicated to be received at the decision block 106 has already been received. And, upon reaching the block 124 of the process 100, in the combined process, a branch is taken back to the decision block 146.

The processes 100 and 132 also do not degrade the overall performance of the receiver in which such processes are utilized as the processes fall back to the use of conventional techniques of receiving all four data bursts and decoding the encoded data block responsive to reception of such four data bursts if the techniques set forth in the processes by which to recover, or otherwise obtain, the informational content of a data block upon reception of less than all of the data bursts that form the data block are otherwise unsuccessful. That is, performance of a receiver employing such processes corresponds to the performance of a receiver in similar poor signal conditions in which the techniques set forth in the processes 100 and 132 are not utilized.

Figure 3:
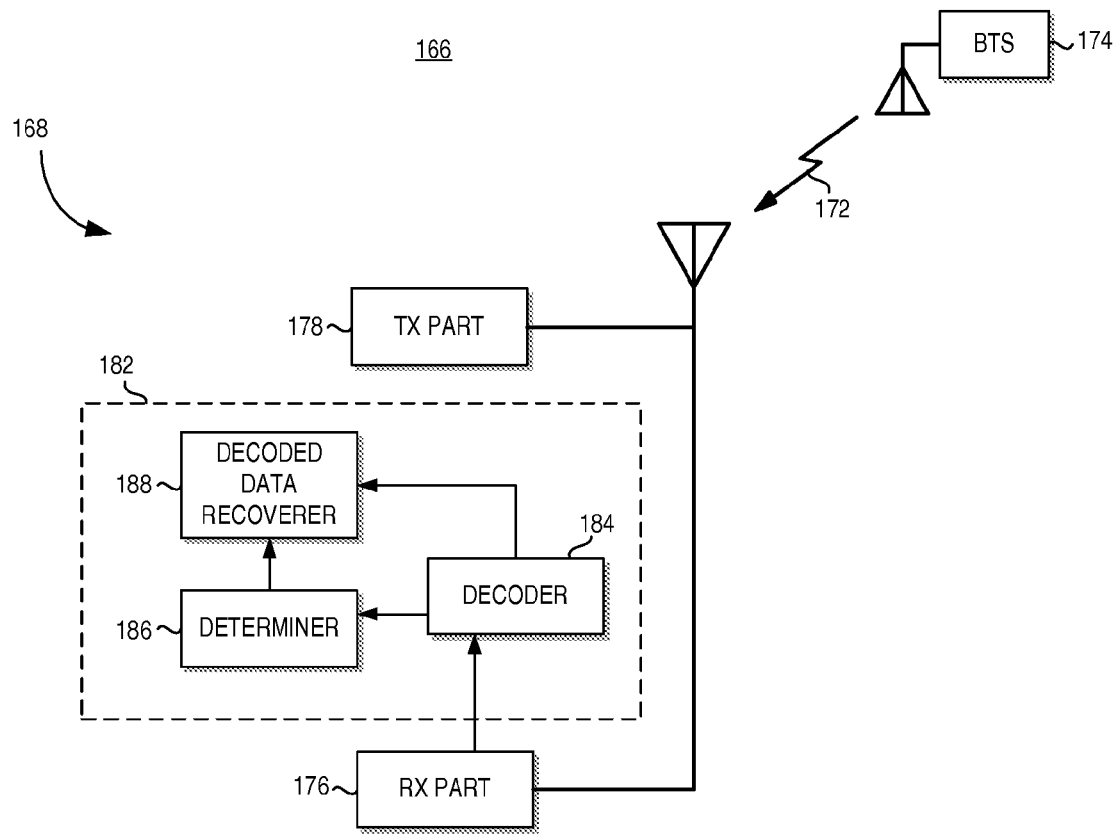
FIG. 3 illustrates a functional block diagram of a radio communication system in which an embodiment of the present invention is operable.

FIG. 3 illustrates a functional block diagram, shown generally at 166, of a radio communication system, here a cellular communication system, in which an embodiment of the present invention is operable. The communication system 166, in the exemplary implementation, is operable generally pursuant to the operational parameters set forth in the operational specification of the GSM system that further provides for GPRS. The teachings of the present invention are also analogously implementable in cellular, and other radio, communication systems operable pursuant to other operational standards.

The communication system includes a network part and one or more mobile stations, of which the mobile station 168 is representative. Communications are effectuated between the mobile station and the network part by way of radio links upon which downlink channels and uplink channels are defined. The radio links are represented in the figure by the arrow 172.

The network part of the communication system includes a plurality of fixed-site transceivers, referred to as base transceiver stations, of which a single base transceiver station (BTS) 174 is shown in the figure. During operation, communication of data between the mobile station 168 and a base transceiver station is effectuated pursuant to a communication service. And, more particularly, encoded data blocks are communicated during operation of the communication system. For instance, a block of data is communicated by the base transceiver station 174 to the mobile station 168. The data block is encoded to form an encoded data block, in manners as described previously, and the encoded data block is communicated upon forward link channels to the mobile station. The communication of the encoded data is effectuated by the communication of a series of four data bursts that together include all of the data of the encoded data burst.

The mobile station is shown to include a receive part 176 and a transmit part 178. The receive part of the mobile station detects delivery thereto of the successive bursts of the encoded data block. The bursts are delivered sequentially, with several millisecond spacings between the successive bursts. The mobile station further includes apparatus 182 of an embodiment of the present invention. The elements forming the apparatus 182 are functionally represented and are implemented in any desired manner, such as by algorithms executable by processing circuitry.

The apparatus includes a detector 184 coupled to the receive part 176. The detector operates to detect delivery to the mobile station of each data burst delivered to the mobile station. The detector provides indicia associated with the data bursts to a determiner 186. The determiner 186 operates to determine signal quality indicia associated with the received data bursts. The determiner at least determines whether the signal quality is better than a selected threshold. And, the determiner also determines whether the coding used to form the data bursts is of a selected coding type. Here, the determiner determines whether the coding type is a CS-1 (coding scheme-1) defined in the appropriate GSM operational specification section. Determinations made by the determiner are provided to a decoded data recoverer 188.

The decoded data recoverer 188 operates selectably to recover the informational content of the encoded data block using, selectably, fewer than all of the data bursts that together form the entire encoded data block. The decoded data recoverer operates to attempt to recover the informational content of the encoded data block with fewer than all of the data bursts upon determination by the determiner that the signal quality conditions are better than a selected threshold and that the coding type by which the data is encoded is of a selected coding type, here the CS-1 coding type.

In one implementation, the apparatus 182 operates to carry out the process set forth previously with respect to the description of the process 100 shown in FIG. 1. In another implementation, the apparatus 182 carries out the process 132, described previously with respect to FIG. 2. And, in another implementation, the apparatus 182 operates to perform the combined processes of the processes 100 and 132.

Because the informational content of the encoded data block is selectably recoverable upon delivery to the mobile station of fewer than all of the data bursts, the power performance of the mobile station, or other radio device that utilizes an embodiment of the present invention, is improved.

Figure 4:
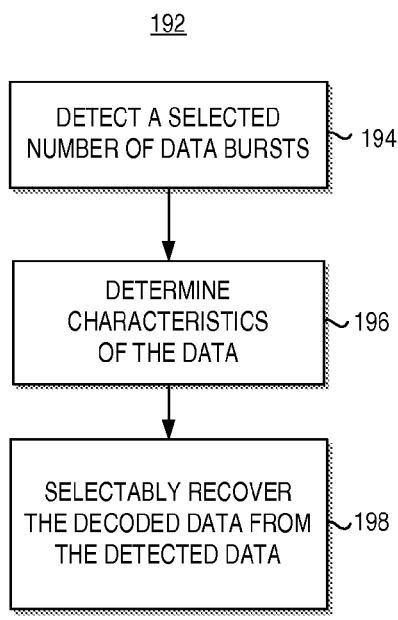
FIG. 4 illustrates a method flow diagram illustrating the method of operation of the method of an embodiment of the present invention.

FIG. 4 illustrates a method, shown generally at 192, of the method of operation of an embodiment of the present invention. The method selectably recovers a decoded data block through detection of fewer than all of the selected number of bursts of data that together form an encoded data block.

First, and as indicated by the block 194, a selected number of at least less than all of the selected number of the bursts of data are detected. Then, and as indicated by the block 196, characteristics of the data are determined. And, as indicated by the block 198, the decoded data is selectably recovered from the detected data. The recovered data is representative of the entire data block.

The previous descriptions are of preferred examples for implementing the invention, and the scope of the invention should not necessarily be limited by this description. The scope of the present invention is defined by the following claims:

What is claimed is:

1. An apparatus for a receiving station that receives block-formatted data, said apparatus comprising:
   a detector configured to detect a portion of a block of the block-formatted data; and
   a data recoverer configured to recover informational content of an entire block of the block-formatted data responsive to detection by said detector for the portion of the block of data if the portion is of a quality better than a selected threshold value.

2. The apparatus of claim 1 wherein said detector is configured to detect successive bursts of data, the successive bursts together comprising the block of the block-formatted data.

3. The apparatus of claim 2 wherein said detector is configured to detect at least one burst of the block of block-formatted data and wherein said data recoverer is configured to recover the informational content of the entire block of the block-formatted data responsive to the detection of the at least one burst of the block of the block-formatted data.

4. The apparatus of claim 3 wherein the block of the block-formatted data is comprised of four bursts of data and wherein said data recoverer is configured to recover the informational content of the entire block of the block-formatted data responsive to detection of fewer than the four bursts of data.

5. The apparatus of claim 4 wherein said data recoverer is configured to recover the informational content of the entire block of the block-formatted data responsive to detection of three of the four bursts of data.

6. The apparatus of claim 1 further comprising a determiner configured to determine if the portion of the block of data is of the quality better than a selected threshold value.

7. The apparatus of claim 1 wherein said data recoverer is configured to recover the informational content of the entire block responsive to detection by said detector of the portion of the block of data and if the portion is of the selected characteristics and if the portion of the block of data is of a selected data type.

8. The apparatus of claim 7 wherein the selected data typed comprises a CS-1 (Code Scheme-1), GSM (Global System for Mobile Communications) data type.

9. The apparatus of claim 1 wherein said data recover is further configured to recover the informational content of the entire block using values of the portion of the block of data and treating remaining values as punctured.

10. The apparatus of claim 1 further comprising a table that identifies first data portions and associated entire blocks of block-formatted data.

11. The apparatus of claim 10 further comprising a comparator configured to compare the portion of the block of the block-formatted data detected by said detector with table-stored data identified at said table.

12. The apparatus of claim 11 wherein said data recoverer is configured to recover the informational content of the entire block using table-stored data identified at said table if comparison made by said comparator indicates a match.

13. The apparatus of claim 1 wherein the receiving station comprises a mobile station and wherein said detector and said data recoverer are embodied at the mobile station.

14. A method of processing circuitry for a receiving station that receives block-formatted data, said method comprising:
   detecting a portion of a block of the block-formatted data; and
   recovering informational content of an entire block of the block-formatted data responsive to detection during said detecting of the portion of the block of data if the portion is of selected characteristics, wherein the selected characteristics comprises quality levels better than a selected threshold value.

15. The method of claim 14 further comprising determining whether the portion is of the selected characteristics.

16. The method of claim 14 wherein said detecting comprises detecting at least a first of successive bursts that together comprise a block of the block-formatted data.

17. The method of claim 16 wherein said recovering the informational content is performed subsequent to detecting the first of the successive bursts and prior to detecting a final one of the successive bursts.

18. A method of processing circuitry for facilitating reception of a CS-1, Coding Scheme-1, GSM, Global System for Mobile communications, data block, said method comprising:
   detecting reception of data bursts comprising a portion of an entire CS-1, GSM data block; and
   recovering informational content of all of the CS-1, GSM data block using values of the data bursts detected during said detecting and using erased bits values for a remaining portion of the data block if the portion is of a quality better than a selected threshold value.

* * * * *